(12) United States Patent
Lee et al.

(10) Patent No.: US 7,482,225 B2
(45) Date of Patent: Jan. 27, 2009

(54) METHOD OF FABRICATING FLOATING GATE OF FLASH MEMORY DEVICE

(75) Inventors: Kang Hyun Lee, Seoul (KR); Jeong Yel Jang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 15 days.

(21) Appl. No.: 11/473,690

(22) Filed: Jun. 23, 2006

(65) Prior Publication Data

US 2006/0292797 A1 Dec. 28, 2006

(30) Foreign Application Priority Data

Jun. 24, 2005 (KR) .................. 10-2005-0055076

(51) Int. Cl.
*H01L 21/336* (2006.01)

(52) U.S. Cl. .............. 438/257; 438/238; 438/381; 257/E21.229; 257/E21.231; 257/E21.245; 257/E21.311; 257/E21.645

(58) Field of Classification Search .......... 438/257, 438/238, 381, 263, 264, 513, 706, 745, 762, 438/780

See application file for complete search history.

(56) References Cited

U.S. PATENT DOCUMENTS

| | | | | | |
|---|---|---|---|---|---|
| 5,525,552 | A | * | 6/1996 | Huang | 438/297 |
| 5,563,098 | A | * | 10/1996 | Kuo et al. | 438/526 |
| 5,719,089 | A | * | 2/1998 | Cherng et al. | 438/637 |
| 5,751,040 | A | * | 5/1998 | Chen et al. | 257/332 |
| 5,861,343 | A | * | 1/1999 | Tseng | 438/666 |
| 6,808,985 | B1 | * | 10/2004 | Lee et al. | 438/257 |

FOREIGN PATENT DOCUMENTS

| | | |
|---|---|---|
| KR | 10-2002-0082545 | 7/2004 |
| KR | 10-2002-0088281 | 7/2004 |

* cited by examiner

*Primary Examiner*—David Nhu
(74) *Attorney, Agent, or Firm*—Saliwanchik, Lloyd & Saliwanchik

(57) ABSTRACT

A method of fabricating a floating gate of a flash memory device is provided. The method includes: forming a tunneling oxide layer on a substrate; forming a conductive thin layer on the tunneling oxide layer; applying a photoresist on the conductive thin layer; defining a floating gate region by patterning the photoresist; forming polymer sidewalls on the sides of the patterned photoresist; and selectively removing the conductive thin layer using the photoresist and the polymer sidewalls as a mask to form a floating gate.

16 Claims, 5 Drawing Sheets

FIG.2A
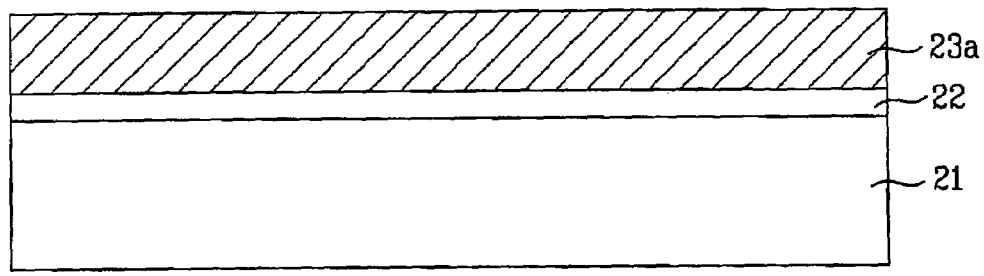
FIG.2B
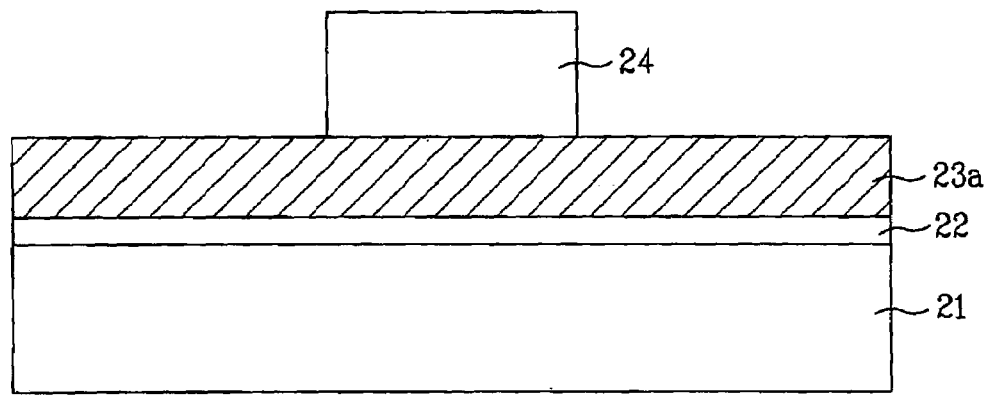
FIG.2C
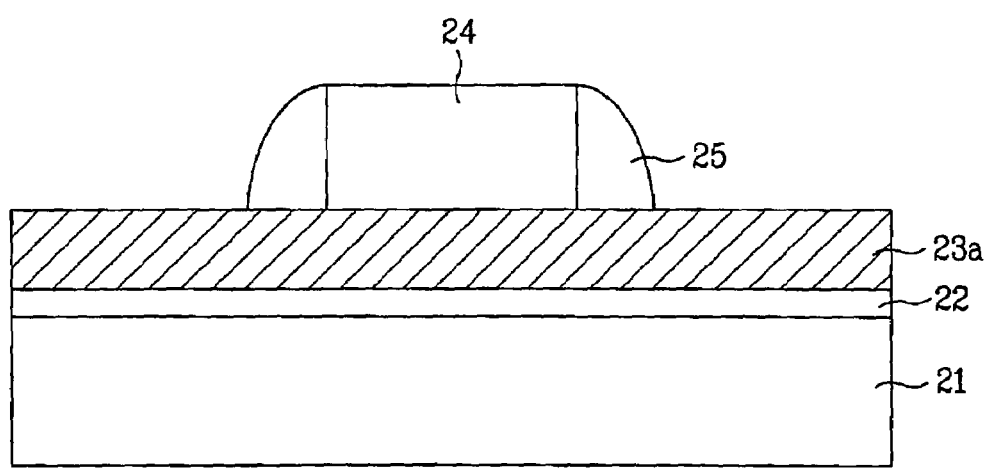
FIG.2D

METHOD OF FABRICATING FLOATING GATE OF FLASH MEMORY DEVICE

RELATED APPLICATION

This application claims the benefit under 35 U.S.C. §119 (e) of Korean Patent Application Number 10-2005-0055076, filed Jun. 24, 2005, which is incorporated herein by reference in its entirety.

FIELD OF THE INVENTION

The present invention relates to a semiconductor memory device, and more particularly, to a method of fabricating a floating gate of a flash memory device with improved productivity and product characteristics.

BACKGROUND OF THE INVENTION

In fabricating a flash memory device of less than 0.18 μm, one important factor is the area of a floating gate where electrons are built up. In related prior art processes of fabricating a flash memory device, a hard mask and oxide spacer structure is used to overcome the difficulties of forming a fine pattern, and thus the process becomes very complicated.

Hereinafter, a related prior art method of fabricating a floating gate of a flash memory device will be described with reference to FIGS. 1A to 1E.

FIGS. 1A to 1E are sectional views illustrating a prior art method of fabricating a floating gate of a flash memory device.

As illustrated in FIG. 1A, a tunneling oxide layer 12, which is 80 Å to 120 Å thick, is formed on a semiconductor substrate 11. A poly silicon layer 13a for a floating gate, which is 900 Å to 1100 Å thick, is formed on the tunneling oxide layer 12.

As illustrated in FIG. 1B, a first oxide layer 14, which is 2000 Å to 2500 Å thick, is formed on the poly silicon layer 13a, and a photoresist 15 is applied on the first oxide layer 14. Then, the photoresist 15 is selectively patterned to define a floating gate region using an exposure and development process.

After the photoresist 15 is applied, an anti-reflective layer (not shown), which is 600 Å thick, can be formed on the photoresist 15.

Next, the first oxide layer 14 is selectively patterned using the patterned photoresist 15 as a mask.

As illustrated in FIG. 1C, the photoresist 15 is removed, and then a cleaning process is performed on the semiconductor substrate 11 to remove any remaining photoresist 15.

Then, a second oxide layer, which is 650 Å to 850 Å thick, is formed on the entire surface of the semiconductor substrate 11 and first oxide layer 14. An etch back process of the second oxide layer is performed to form the second oxide layer sidewalls 16 on the sides of the first oxide layer 14.

As illustrated in FIG. 1D, using the first oxide layer 14 and the second oxide layer sidewalls 16 as a hard mask, the poly silicon layer 13a is selectively etched to form a floating gate 13.

Here, the floating gate 13 has a width broader than that of the floating gate region defined by the patterned photoresist 15.

As illustrated in FIG. 1E, a wet etching process is performed to remove the first oxide layer 14 and the second oxide layer sidewall 16. Then, subsequent processes can be performed.

When space less than 100 nm can be patterned on the poly silicon layer 13a through the photoresist pattern, the hard mask process is unnecessary. However, it is not possible to form a fine pattern less than 100 nm in the prior art photo process discussed above so a fine pattern less than 100 nm is formed using the hard mask such as an oxide layer.

Once the fine pattern is formed, the oxide layer used as the hard mask is removed through a wet process. At this point, productivity is decreased and product characteristics are deteriorated due to the various defects.

SUMMARY OF THE INVENTION

Accordingly, the present invention is directed to a method of fabricating a floating gate of a flash memory device that addresses and/or substantially obviates one or more problems, limitations, and/or disadvantages of the prior art.

An object of the present invention is to provide a method of forming a floating gate of a flash memory device that can improve productivity and product characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating a floating gate of a flash memory device, the method incorporating: forming a tunneling oxide layer on a substrate; forming a conductive thin layer on the tunneling oxide layer; applying a photoresist on the conductive thin layer; defining a floating gate region by patterning the photoresist; forming sidewalls on the sides of the patterned photoresist; and selectively removing the conductive thin layer using the photoresist and the sidewalls as a mask to form a floating gate.

In another aspect of the present invention, there is provided a method of fabricating a floating gate of a flash memory device, the method incorporating: forming a conductive thin layer on a substrate; defining a floating gate region on the conductive thin film by forming a photosensitive pattern for etching; forming sidewalls on the sides of the photosensitive pattern; and selectively removing the conductive thin layer using the photosensitive pattern and the sidewalls as a mask to form a floating gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2A to 2E are sectional views illustrating a method of fabricating a floating gate of a flash memory device according to an embodiment of the present invention.

DETAILED DESCRIPTION OF THE INVENTION

Figure 1A:
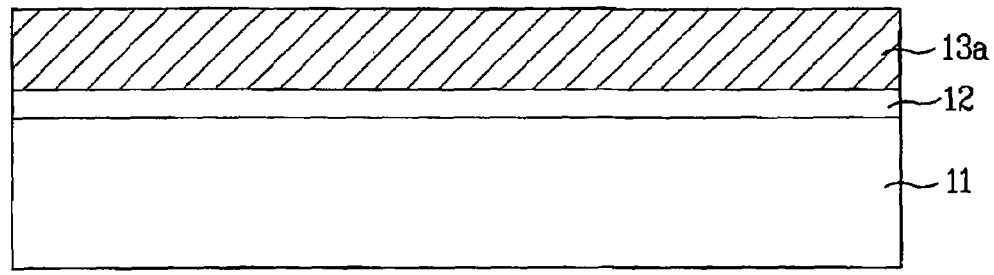
FIGS. 1A to 1E are sectional views illustrating a prior art method of fabricating a floating gate of a flash memory device.
Figure 1B:
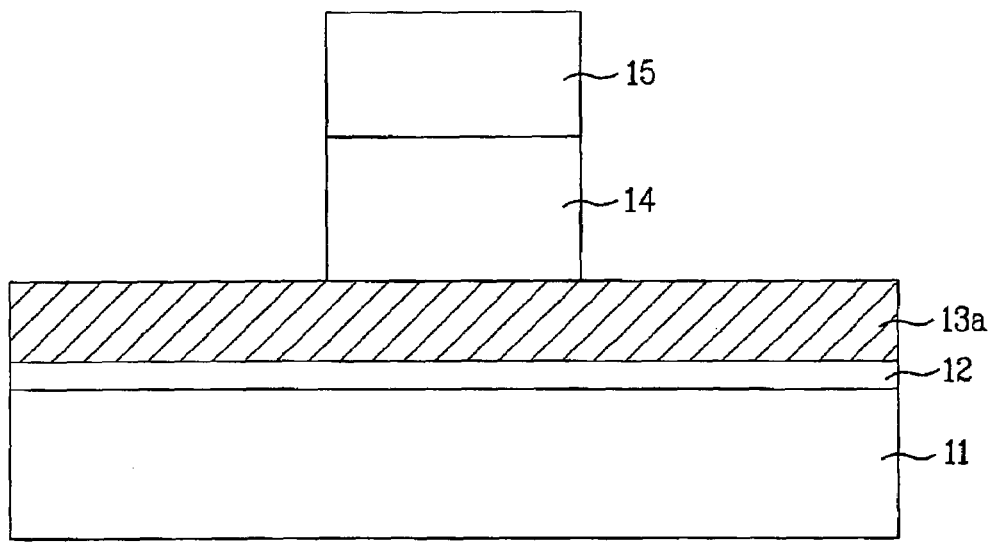
Figure 1C:
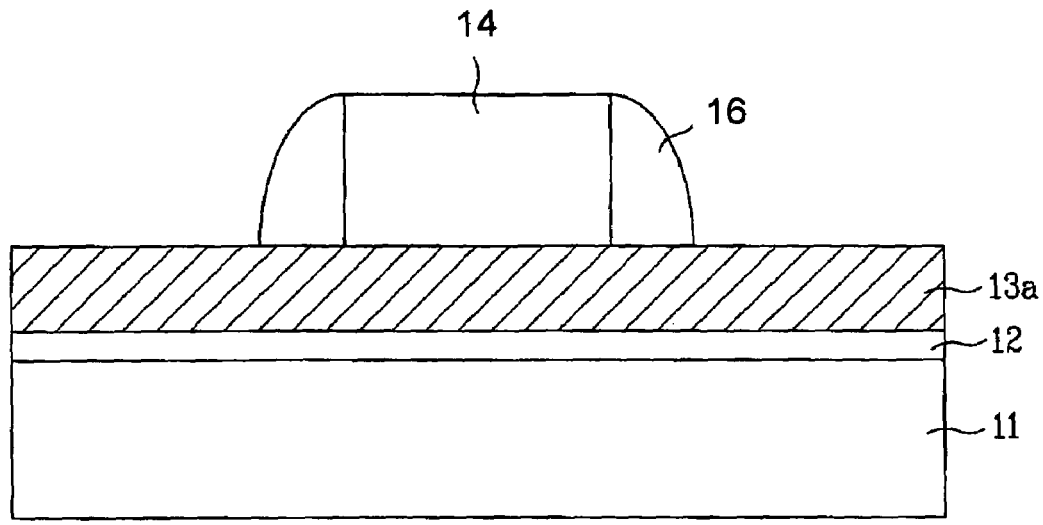
Figure 1D:
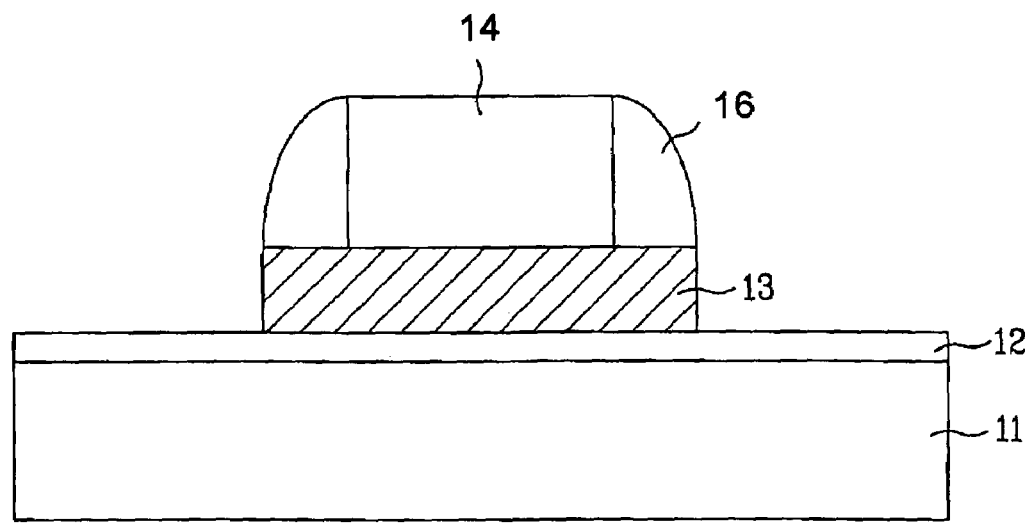
Figure 1E:
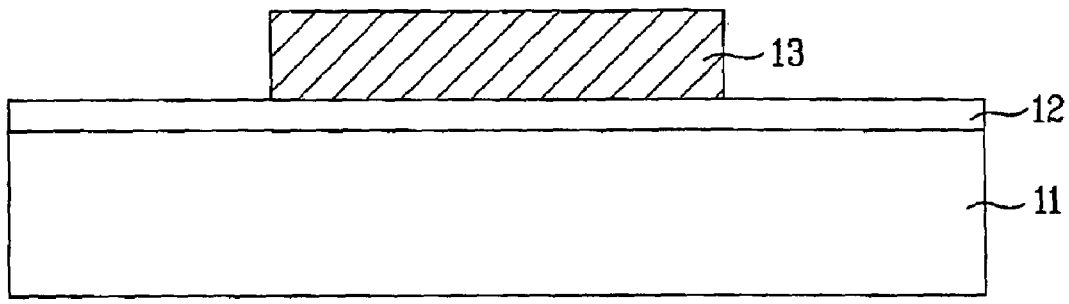

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2E are sectional views illustrating a method of fabricating a floating gate of a flash memory device according to an embodiment of the present invention.

As illustrated in FIG. 2A, a tunneling oxide layer 22 can be formed on a semiconductor substrate 21. In a specific embodiment, the tunneling oxide layer 22 can be 80 Å to 120 Å thick. Then, a poly silicon layer 23a for a floating gate can be formed on the tunneling oxide layer 22. In a specific embodiment, the poly silicon layer 23a can be 900 Å to 1100 Å thick.

As illustrated in FIG. 2B, a photoresist 24 can be applied to the surface of the semiconductor substrate 21 on the poly silicon layer 23a. Then, the photoresist 24 can be selectively patterned to define a floating gate region using an exposure and development process. After the photoresist 24 is applied, an anti-reflective layer (not shown) can be formed on the photoresist 24. In one embodiment, the anti-reflective layer can be 600 Å thick.

In embodiments, the photoresist 24 can be applied, for example, by using a spin coat process, a spray coat process, or a deep coat process. In a preferred embodiment, the spin coat process that spins a wafer (attached to a chuck) in vacuum with a high speed can be used to provide excellent stability and uniformity of the photoresist.

Once the photoresist is applied, a photo mask (not shown) corresponding to a desired pattern can be provided for the photoresist 24. Accordingly, a photoresist pattern can be formed to have the desired pattern through an exposure and development process.

In embodiments, the development process can be performed by a deposition method or a spray method. Regarding the deposition method, it can be difficult to manage temperature, density, and a change with the passage of time. However, the spray method can be relatively easy to manage. In-line Devices using a spray method are widely used in various fields.

In one embodiment, a photosensitive pattern for etching can be used to define the floating gate region.

As illustrated in FIG. 2C, after patterning the photoresist 24, a polymer 25 can be formed on the sides of the photoresist 24.

In one embodiment, the polymer 25 can be formed on the sides of the photoresist 24 through generation of a plasma of a carbon rich gas such as $CH_2F_2$ or $C_4F_8/C_5F_8$.

As illustrated in FIG. 2D, the poly silicon layer 23a can be plasma-etched to form the floating gate 23 using the photoresist 24 and the polymer 25 as a mask.

In a specific embodiment of the plasma etching process, the poly silicon layer 23a can be dry-etched with an HBr gas using a high selectivity of the photoresist 24, the polymer 25, and the poly silicon layer 23a.

Figure 2E:
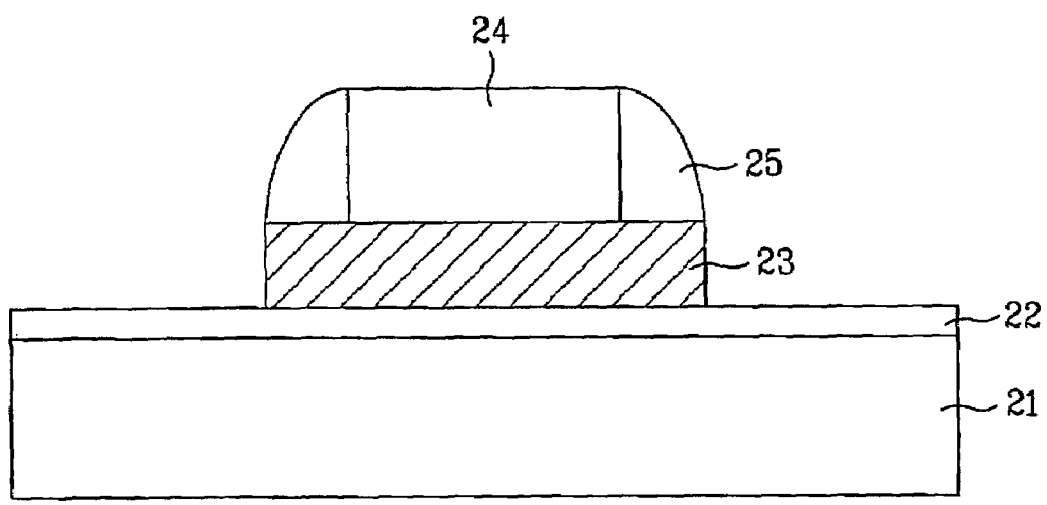
Figure 2E:
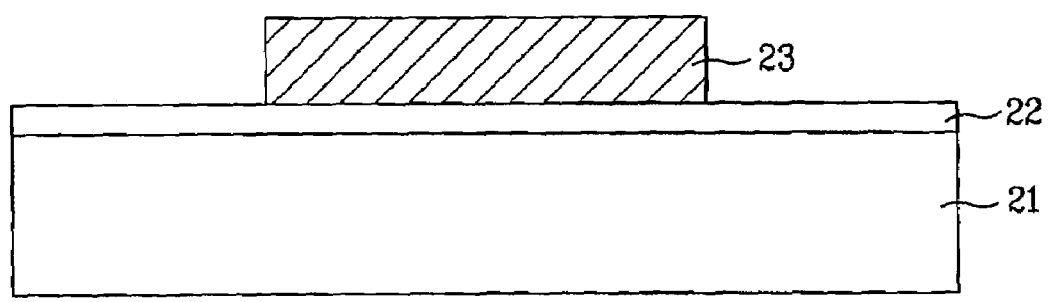

As illustrated in FIG. 2E, an oxygen ashing and cleaning process can be performed on the semiconductor substrate 21 to remove the photoresist 24 and the polymer 25 from the semiconductor substrate 21. Then, subsequent processes can be performed.

In a further embodiment, after forming the floating gate 23, methods using an oxygen gas plasma or various oxidizers can be used to remove the photoresist 24.

In a specific embodiment, the method using the oxygen gas plasma can incorporate injecting an oxygen gas under conditions of vacuum and a high voltage to generate the oxygen gas plasma. The photoresist 24 can be removed in response to the oxygen gas plasma.

In a specific embodiment, the method using the various oxidizers can incorporate a heat concentrated sulfuric acid or a mixed solution of heat concentrated sulfuric acid and hydrogen peroxide.

A method of fabricating a floating gate of a flash memory device can provide the following effects.

First, through a byproduct such as the generated polymer during etching, the poly silicon layer can be selectively etched to form the floating gate, and thus productivity and product characteristics can be improved.

Second, the number of process steps can be simplified, and thus the manufacturing cost can be reduced.

It will be apparent to those skilled in the art that various modifications and variations can be made in the present invention. Thus, it is intended that the present invention covers the modifications and variations of this invention provided they come within the scope of the appended claims and their equivalents.

We claim:

1. A method of fabricating a floating gate of a flash memory device, the method comprising:
    forming a tunneling oxide layer on a substrate;
    forming a conductive thin layer on the tunneling oxide layer;
    applying a photoresist to the conductive thin layer;
    defining a floating gate region by patterning the photoresist;
    forming sidewalls on sides of the patterned photoresist;
    selectively removing a part of the conductive thin layer using the photoresist and the sidewalls as a mask to form a floating gate; and
    removing the photoresist and the sidewalls after forming the float gate, wherein removing the photoresist and the sidewalls comprises removing the photoresist by using an oxidizer.

2. The method according to claim 1, wherein the sidewalls are formed of a polymer.

3. The method according to claim 2, wherein the polymer is formed on the sides of the photoresist by generating plasma on a surface of the photoresist through a carbon rich gas.

4. The method according to claim 3, wherein the carbon rich gas is formed of $CH_2F_2$ or $C_4F_8/C_5F_8$.

5. The method according to claim 1, wherein selectively removing the conductive thin layer is performed by a plasma etching process using a high selectivity of the photoresist, the polymer, and the conductive thin layer.

6. The method according to claim 5, wherein the plasma etching process uses an HBr gas.

7. The method according to claim 1, wherein removing the photoresist and the sidewalls comprises using an oxygen plasma.

8. The method according to claim 1, wherein the oxidizer is a mixed solution of heat concentrated sulfuric acid and hydrogen peroxide.

9. A method of fabricating a floating gate of a flash memory device, the method comprising:
    forming a conductive thin layer on a substrate;
    forming a photosensitive pattern defining a floating gate region on the conductive thin film;

forming sidewalls on sides of the photosensitive pattern;

selectively removing a part of the conductive thin layer using the photosensitive pattern and the sidewalls as a mask to form a floating gate; and removing the photosensitive pattern and the sidewalls after forming the floating gate, wherein removing the photosensitive pattern and the sidewalls comprises removing the photosensitive pattern by using an oxidizer.

10. The method according to claim 9, wherein the sidewalls are formed of a polymer.

11. The method according to claim 10, wherein the polymer is formed on the sides of the photosensitive pattern by generating plasma on a surface of the photosensitive pattern through a carbon rich gas.

12. The method according to claim 11, wherein the carbon rich gas is formed of $CH_2F_2$ or $C_4F_8/C_5F_8$.

13. The method according to claim 9, wherein selectively removing the conductive thin layer is preformed by a plasma etching process using a high selectivity of the photosensitive pattern, the polymer, and the conductive thin layer.

14. The method according to claim 13, wherein the plasma etching process uses an HBr gas.

15. The method according to claim 9, wherein removing the photosensitive pattern and the sidewalls comprises using an oxygen plasma.

16. The method according to claim 9, wherein the oxidizer is a mixed solution of heat concentrated sulfuric acid and hydrogen peroxide.

* * * * *